United States Patent
Isoshima et al.

(10) Patent No.: US 8,320,119 B2
(45) Date of Patent: Nov. 27, 2012

(54) IMAGE DISPLAY

(75) Inventors: Nobuyuki Isoshima, Mito (JP); Kohei Miyoshi, Fujisawa (JP); Mika Ri, Yokohama (JP); Yutaka Yamada, Yokohama (JP); Toshihiro Tsutsui, Inagi (JP); Teppei Tanaka, Kawasaki (JP); Hidenao Kubota, Yokohama (JP); Yuzo Nishinaka, Chigasaki (JP)

(73) Assignee: Hitachi Consumer Electronics Co., Ltd., Tokyo (JP)

( * ) Notice: Subject to any disclaimer, the term of this patent is extended or adjusted under 35 U.S.C. 154(b) by 208 days.

(21) Appl. No.: 12/649,398

(22) Filed: Dec. 30, 2009

(65) Prior Publication Data

US 2010/0172098 A1 Jul. 8, 2010

(30) Foreign Application Priority Data

Jan. 8, 2009 (JP) ................................ 2009-002115

(51) Int. Cl.
*H05K 7/20* (2006.01)
(52) U.S. Cl. ......... 361/679.47; 361/679.21; 361/679.22; 361/690; 361/704; 361/715; 165/104.34
(58) Field of Classification Search ............ 361/679.21, 361/679.22, 679.47, 690, 704, 715; 165/80.3, 165/104.33, 185, 104.34; 313/46; 345/60, 345/905; 348/748; 349/161
See application file for complete search history.

(56) References Cited

U.S. PATENT DOCUMENTS

| | | | |
|---|---|---|---|
| 6,067,133 A * | 5/2000 | Niibori et al. ................... 349/60 |
| 6,366,264 B1 * | 4/2002 | Kurumada ...................... 345/60 |
| 6,373,702 B2 * | 4/2002 | Oishi et al. ..................... 361/704 |
| 6,657,620 B2 * | 12/2003 | Oishi et al. ..................... 345/204 |
| 6,744,186 B2 * | 6/2004 | Oishi et al. ....................... 313/46 |
| 6,833,674 B2 * | 12/2004 | Kaneko et al. ................. 313/587 |
| 7,215,549 B2 * | 5/2007 | Kim ............................... 361/704 |
| 7,224,121 B2 * | 5/2007 | Ahn .............................. 313/582 |
| 7,345,878 B2 * | 3/2008 | Kim ............................... 361/703 |

(Continued)

FOREIGN PATENT DOCUMENTS

JP 2001-022281 1/2001

(Continued)

OTHER PUBLICATIONS

JP/2001-022, 281 English machine translation, Jan. 26, 2001.*

*Primary Examiner* — Anatoly Vortman
(74) *Attorney, Agent, or Firm* — Antonelli, Terry, Stout & Kraus, LLP.

(57) ABSTRACT

For improving a cooling efficiency of a display panel in a flat-type image display, various substrates and an image display element are disposed within a thin-sized housing thereof, including: a display panel; a chassis supporting the display panel from a rear surface side thereof; a front surface-side cover on a front side of the display panel; a rear surface-side cover on a rear side of the display panel; an image display element connected to the display panel; a display driver substrate connected to the display panel, and on a surface thereof opposite to the chassis are provided circuit parts; a power source substrate, supplying driving power to the display driver substrate and the image display element, and on a surface thereof opposite to the chassis are provided circuit parts thereof; and a first insulator board opposite to the display driver substrates and the power source substrate of the chassis.

6 Claims, 16 Drawing Sheets

U.S. PATENT DOCUMENTS

| | | | |
|---|---|---|---|
| 7,372,699 B2 * | 5/2008 | Kim | 361/704 |
| 7,375,969 B2 * | 5/2008 | Jeong | 361/719 |
| 2005/0077822 A1 * | 4/2005 | Kim et al. | 313/582 |
| 2005/0088093 A1 * | 4/2005 | Kim et al. | 313/582 |
| 2005/0117304 A1 * | 6/2005 | Kim | 361/704 |
| 2005/0212426 A1 * | 9/2005 | Ahn | 313/582 |
| 2005/0243106 A1 * | 11/2005 | Bae et al. | 345/679 |
| 2005/0286228 A1 * | 12/2005 | Kim | 361/704 |
| 2006/0061968 A1 * | 3/2006 | Woo et al. | 361/704 |
| 2006/0077620 A1 * | 4/2006 | Kim | 361/679 |
| 2006/0098398 A1 * | 5/2006 | Kim | 361/681 |
| 2006/0098412 A1 * | 5/2006 | Kim et al. | 361/704 |
| 2006/0125365 A1 * | 6/2006 | Kim et al. | 313/46 |
| 2006/0132692 A1 * | 6/2006 | Mo et al. | 349/129 |
| 2006/0133046 A1 * | 6/2006 | Kim et al. | 361/714 |
| 2006/0152905 A1 * | 7/2006 | Kim et al. | 361/715 |
| 2006/0158845 A1 * | 7/2006 | Kim | 361/687 |
| 2006/0158851 A1 * | 7/2006 | Bae et al. | 361/700 |
| 2006/0170349 A1 * | 8/2006 | Kim | 313/582 |
| 2006/0181853 A1 * | 8/2006 | Jeong | 361/704 |
| 2006/0187372 A1 * | 8/2006 | Kim et al. | 349/58 |
| 2006/0187641 A1 * | 8/2006 | Shin | 361/704 |
| 2006/0187644 A1 * | 8/2006 | Jeong | 361/704 |
| 2006/0198089 A1 * | 9/2006 | Cho | 361/681 |
| 2006/0203143 A1 * | 9/2006 | Shin | 349/58 |
| 2006/0214583 A1 * | 9/2006 | Jeong | 313/582 |
| 2006/0232509 A1 * | 10/2006 | Jeong | 345/60 |
| 2006/0244875 A1 * | 11/2006 | Ahn | 349/58 |
| 2006/0261737 A1 * | 11/2006 | Bae | 313/582 |
| 2006/0262241 A1 * | 11/2006 | Jeong | 349/58 |
| 2006/0275965 A1 * | 12/2006 | Jeong | 438/166 |
| 2006/0291162 A1 * | 12/2006 | Kim | 361/695 |
| 2006/0291163 A1 * | 12/2006 | Kim | 361/695 |
| 2007/0002535 A1 * | 1/2007 | Kim | 361/692 |
| 2007/0018577 A1 * | 1/2007 | Hwang | 313/582 |
| 2007/0052335 A1 * | 3/2007 | Shin | 313/46 |
| 2007/0054524 A1 * | 3/2007 | Lee et al. | 439/157 |
| 2007/0076396 A1 * | 4/2007 | Kim | 361/796 |
| 2007/0108909 A1 * | 5/2007 | Jeong | 313/613 |
| 2007/0127215 A1 * | 6/2007 | Jeong | 361/710 |
| 2007/0188675 A1 * | 8/2007 | Tsubokura et al. | 349/58 |
| 2007/0228965 A1 * | 10/2007 | Cha et al. | 313/582 |
| 2007/0229401 A1 * | 10/2007 | Kim | 345/60 |
| 2007/0247053 A1 * | 10/2007 | Yoo | 313/489 |
| 2007/0267174 A1 * | 11/2007 | Kim | 165/80.3 |
| 2009/0115919 A1 * | 5/2009 | Tanaka et al. | 348/836 |
| 2009/0174626 A1 * | 7/2009 | Isoshima et al. | 345/55 |
| 2010/0066937 A1 * | 3/2010 | Yamashita et al. | 349/58 |

FOREIGN PATENT DOCUMENTS

| | | |
|---|---|---|
| JP | 2005-235843 | 9/2005 |

* cited by examiner

IMAGE DISPLAY

BACKGROUND OF THE INVENTION

The present invention relates to an image display, and in particular, to cooling for display panels (such as: a plasma display, a LCD display, an OLED display, etc.), for example, and/or cooling for various kinds of boards, and image processing elements thereof, as well.

For a flat-type image display (such as a plasma display and a liquid crystal display, etc.), high-brightness and high-definition of images or pictures are required, and with an increase of a number of electronic parts used for image processing, heat generated by the display panel and various kinds of substrates also increases. Therefore, cooling of such heat generating parts becomes a problem to be solved.

A display described in Patent Document 1 [Japanese Patent Laying-Open No. 2005-235843 (2005)] achieves a solution for said heat generation problem of the display panel module and the various kinds of substrates. Patent Document 1 discloses structures for conducting the cooling of the display panel module, and various kinds of substrates for discharging heat therefrom, with provision of a cooling fan obliquely installed on a ceiling portion of a back cover.

Also, an additional image display that achieves a solution for the problem of the increase of heat generation of the display panel and the various kinds of substrates is described in Patent Document 2 [Japanese Patent Laying-Open No. 2001-22281 (2001)]. Patent Document 2 discloses structures for conducting the cooling of the display panel module and the various kinds of substrates, including providing a side-surface of a substrate, with circuit parts installed, facing a side of the display panel.

BRIEF SUMMARY OF THE INVENTION

Demand has increased in recent years for reduced thickness of image displays, in combination with high-brightness and high-definition. In order to achieve a high-quality design, as well as to achieving an ease of wall hanging (i.e., hanging the image display on a wall for the purpose of viewing/listening), it is necessary to achieve further thickness reduction and weight reduction, in comparison to existing thin-type image displays.

In order to achieve thickness reduction, it is necessary to reduce the thickness of a space on a rear surface thereof, which occupies most of the depth of the image display. With this thickness reduction of the rear surface, in combination with the thickness reduction of the various kinds of substrates and/or members to be installed, it is necessary to reduce the distances defined between the various kinds of substrates and a base chassis for supporting the display panel thereon, and also the distance defined between the various kinds of substrates and the cover on the side of the rear surface.

When reducing these distances, an airflow convection, formed in the distance between the various kinds of substrates and the chassis and/or a gap portion therebetween, becomes smaller. Therefore, there is a problem that heat radiation of the display panel through the chassis is reduced. Furthermore, because the distance between the substrates and the chassis becomes smaller, the necessary distance cannot be maintained for obtaining an insulation between circuit parts which are installed on the substrates and the chassis.

In this instance, there is a necessity of installing a new insulator member between the substrates and the chassis. The structure for installing a plate-like insulator board as the insulator member is simple (from a structural viewpoint). However, the insulator board has a very low thermal-conductivity of around 0.1 to 1 (W/m·° K), compared to the thermo conductivity of the chassis made of a metal material (such as: an iron alloy or an aluminum alloy, etc.), in many cases having a thermal-conductivity of around 30 to 200 (W/m·° K). For this reason, the insulator board on the base chassis prevents a flow of heat dissipation into air within the inside of the image display, from the display panel through the chassis. As a result, there is a problem that an efficiency of heat radiation or dissipation of the display panel is further reduced, in particular via the chassis in the portion where the insulator board is provided.

Also, within a conventional image display, as disclosed in the Patent Document 1, such a structure is adopted, in many cases, in order to achieve cooling by accelerating ventilation within the apparatus, including by providing a relatively large-sized axial fan on an upper portion of the back cover, on the rear surface of the apparatus. However, when trying to reduce the thickness of the image display, as a whole, from around 100 mm of the conventional art down to around 35 mm (for example), a suction surface of the axial fan comes close to the chassis (i.e., approximately 10 mm away), and an exhaust surface also comes close to the cover on the non-display side of the display. For this reason, both the suction surface and the exhaust surface come close to obstructions, resistance in ventilation is increased, and a flow rate is greatly reduced. Therefore, there is a problem that the efficiency in cooling of the display panel is reduced. The flow rate can be increased if the rotating speed of the axial fan is increased, but the result is another problem (that fan noise is increased).

Also, with new image displays, every year high-brightness and high-definition of images is improved, and the number of the electronic parts used for image processing has a tendency of increasing. In particular, there is a trend of adopting structures within the image display (i.e., disposing image display elements in an upper end portion of the display panel, in addition to a lower end portion thereof), so as to deal with high-definition. In this instance, since the display panel is gradually heated from a lower side thereof, and since the axial fan is located on an upper side of the display panel, where rising air temperature thereof can be easily accumulated, then heat radiation or dissipation becomes insufficient with the structures disclosed in the Patent Document 1. Therefore, there is a possibility that the temperature of parts exceed an upper limit value. It is possible to dispose all of the image display elements in the lower end portion of the display panel, in order to compensate or supplement the shortage of cooling for image display elements in the upper end portion of the display panel. However, when disposing image display elements in this manner, there is also a problem that the temperatures of image display elements and the display panel in the vicinity thereof are increased, if the heat generation of image display elements continues for a long time-period.

Also, within a conventional image display, opening(s) are often provided in a middle portion of the rear surface cover (not only in the upper side and the lower side of the rear surface cover), for the purpose of improving heat radiation or dissipation due to accelerating suction/exhaustion of air from/into an outside of the apparatus. However, when providing opening(s) in the middle portion of the rear surface cover, there result new problems, in that the design quality or characteristic of the apparatus is reduced, and that it becomes difficult to block or shield propagation of the sound noises of the fan inside the apparatus and electromagnetic noises from a substrate for a power source.

An objective of the present invention is to provide an image display for increasing or improving the cooling efficiency of:

the display panel, various kinds of substrates, and/or image display elements of within the thin-sized image display; but without an accompanying increase of fan noises.

To accomplish the objective mentioned above, according to the present invention, there is provided an image display, comprising: a display panel; a chassis, which supports said display panel from a rear surface side thereof; a front surface-side cover provided on a front side of said display panel; a rear surface-side cover provided on a rear side of said display panel; an image display element connected to said display panel; a display driver substrate connected to said display panel, and on a surface of which opposite to said chassis are provided circuit parts thereof; a power source substrate, which supplies driving power to said display driver substrate and said image display element, and on a surface of which opposite to said chassis are provided circuit parts thereof; and a first insulator board provided at a position opposite to said display driver substrates and said power source substrate of said chassis.

According to the present invention, it is possible to cool the heat generating parts (such as: a display panel, display driver substrates, and a image display element, etc.), with stability, while suppressing noises heard outside of the apparatus; and also to maintain electrical insulation among: circuit parts, a chassis, and a non-display side cover. Accordingly, it is possible to provide an image display having high-brightness and high-definition, as well as high reliability, and also having easy wall hanging installation and high design quality.

BRIEF DESCRIPTION OF THE SEVERAL VIEWS OF THE DRAWING

Those and other objectives, features, and advantages of the present invention will become more readily apparent from the following detailed description, when taken in conjunction with the accompanying drawings wherein.

DETAILED DESCRIPTION OF THE PREFERRED EMBODIMENTS

Embodiment 1

Figure 1:
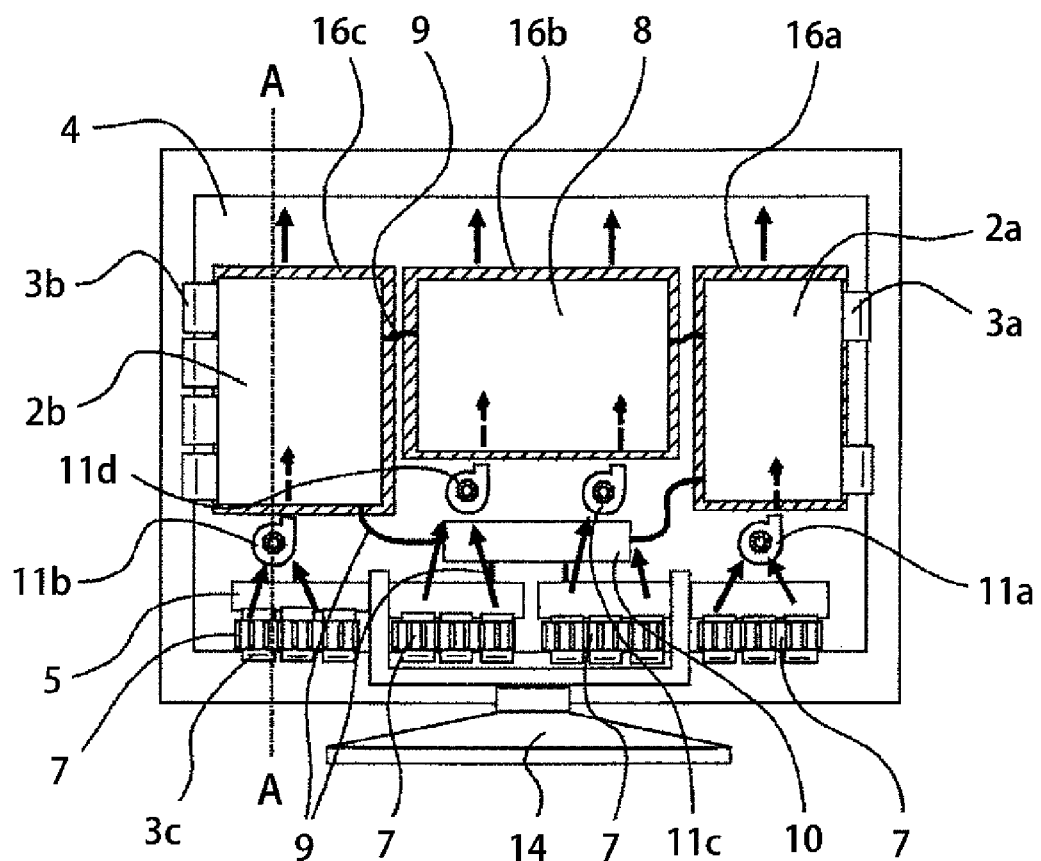
FIG. 1 is a rear side open-up view showing the principle portions of an image display, according to an embodiment 1 of the present invention.
Figure 2:
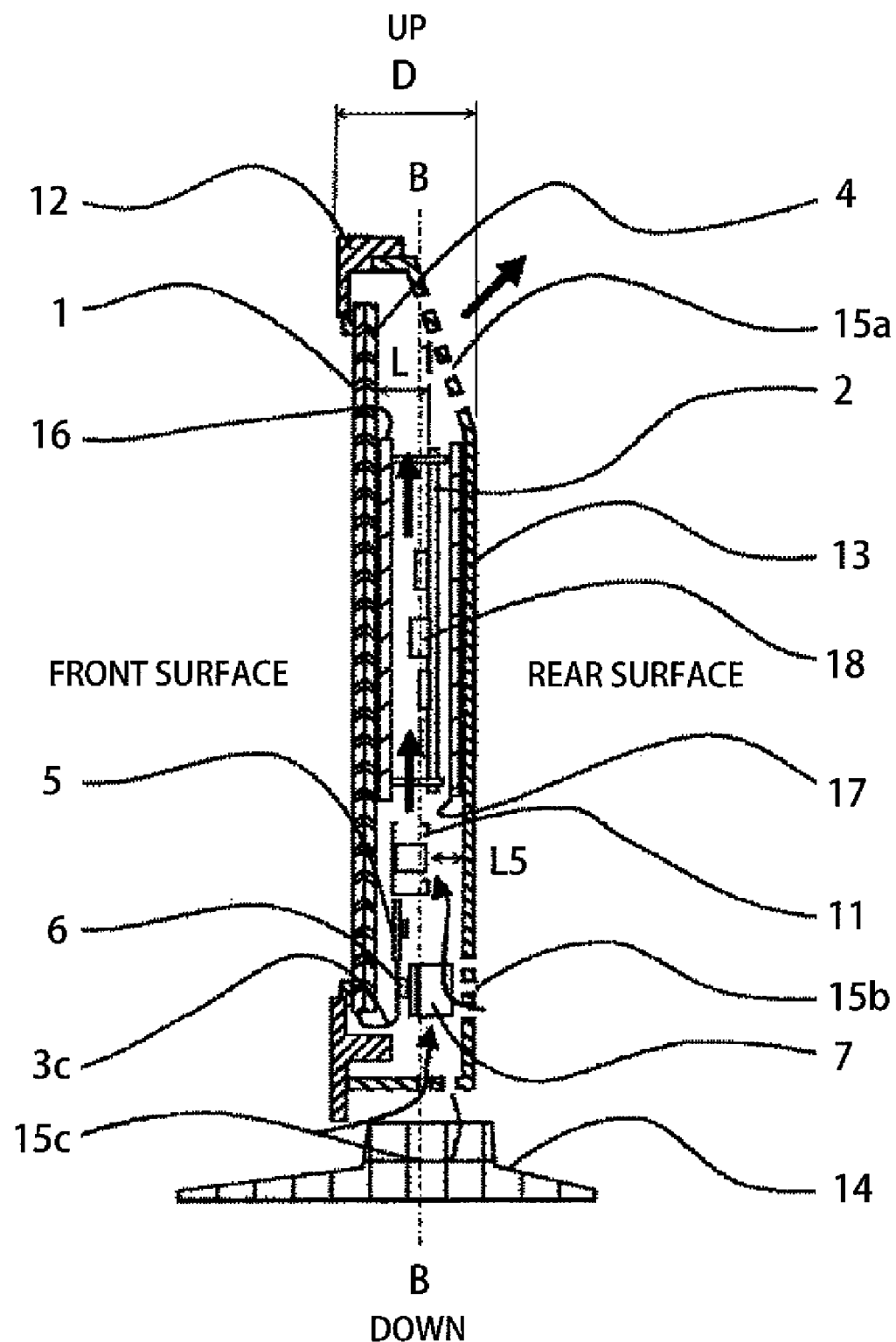
FIG. 2 is an A-A cross-section view of the image display, seeing from a side surface in FIG. 1.
Figure 3:
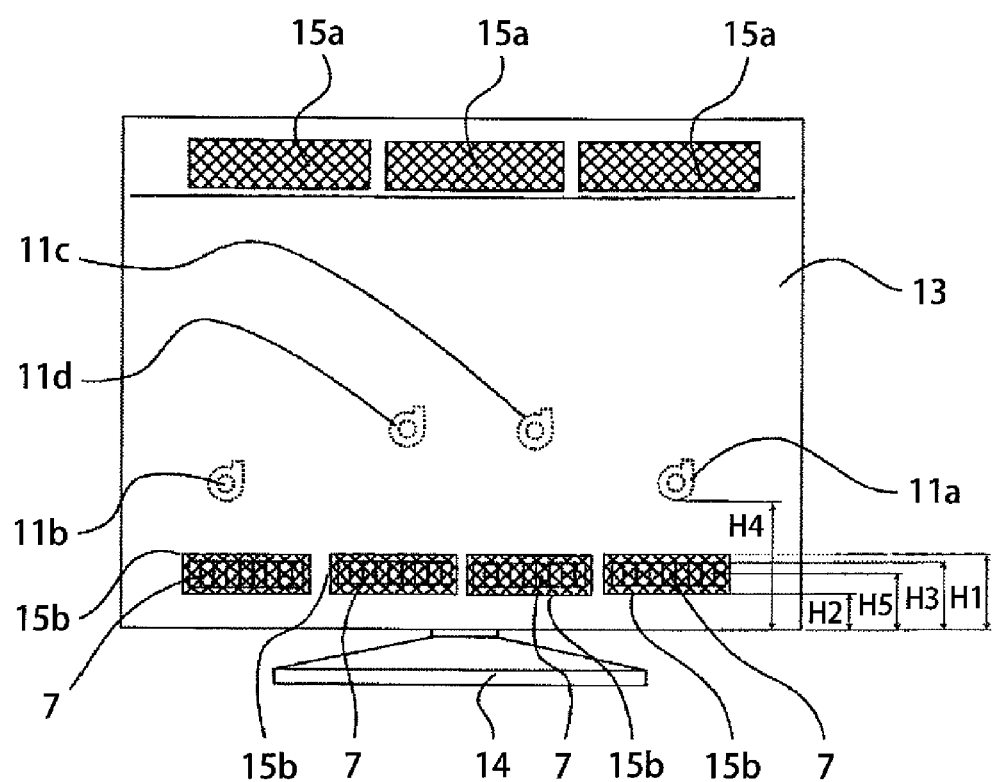
FIG. 3 is an outlook view of a rear surface side of the image display shown in FIG. 1.
Figure 4:
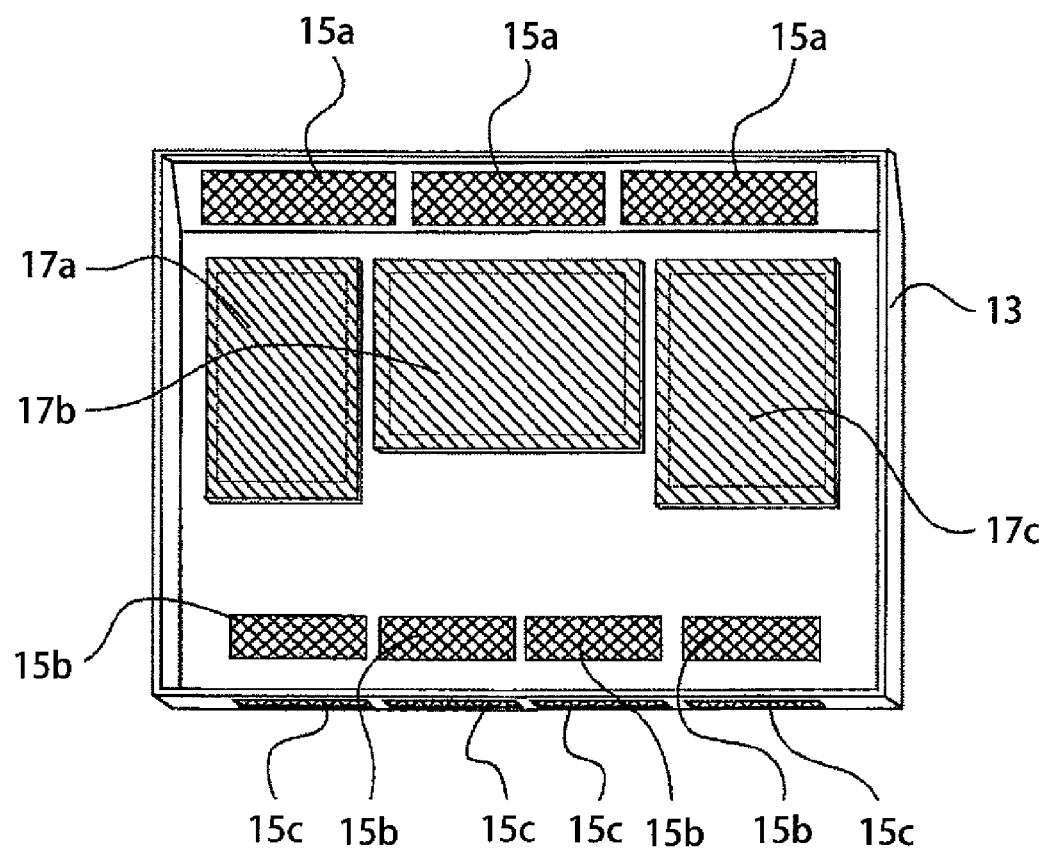
FIG. 4 is a view showing a cover of the image display on the rear-surface side, seen from an inside of a housing shown in FIG. 1.
Figure 5:
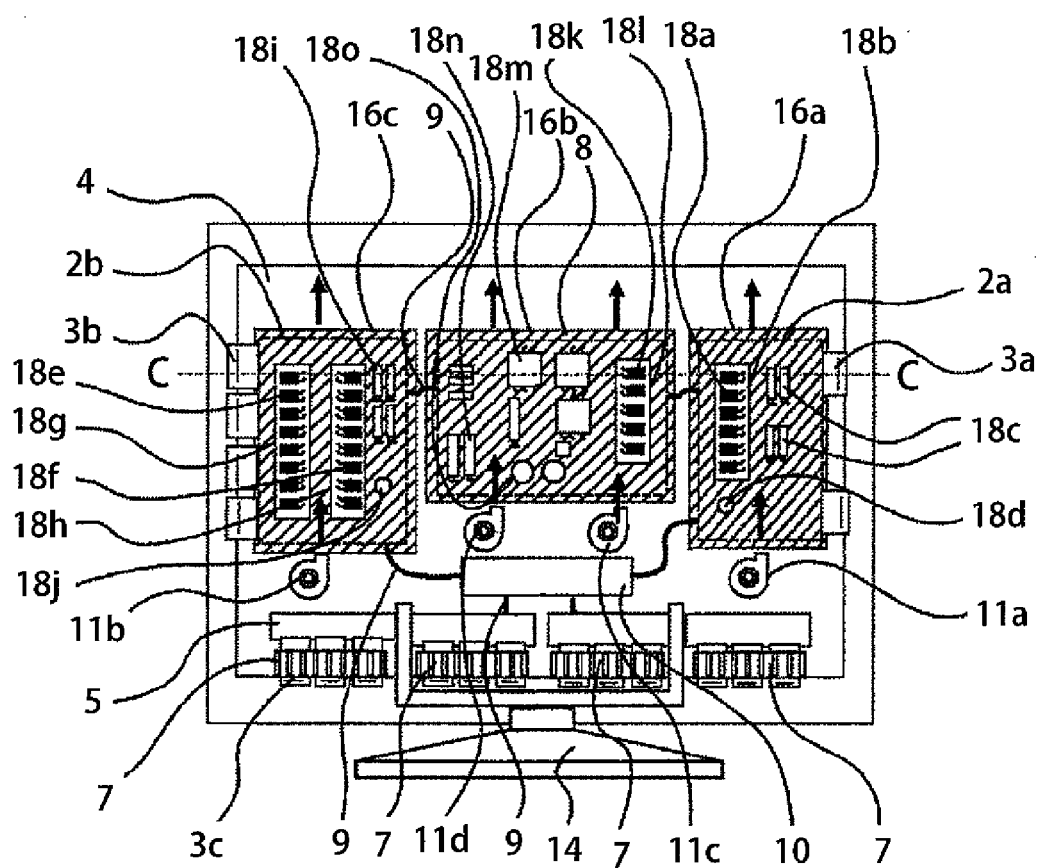
FIG. 5 is a B-B cross-section view showing the image display shown in FIG. 2, seen from a rear surface thereof.
Figure 6:
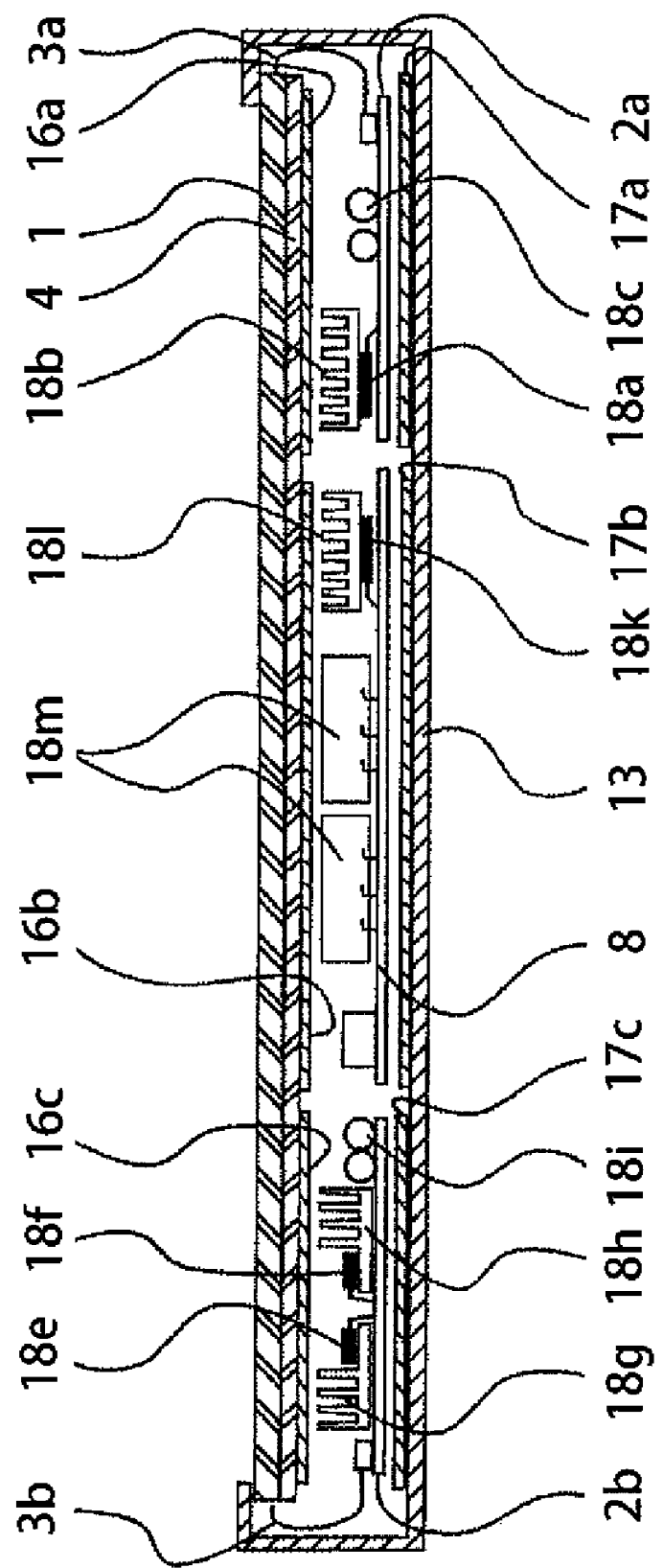
FIG. 6 is a C-C cross-section view showing the image display shown in FIG. 5.
Figure 7:
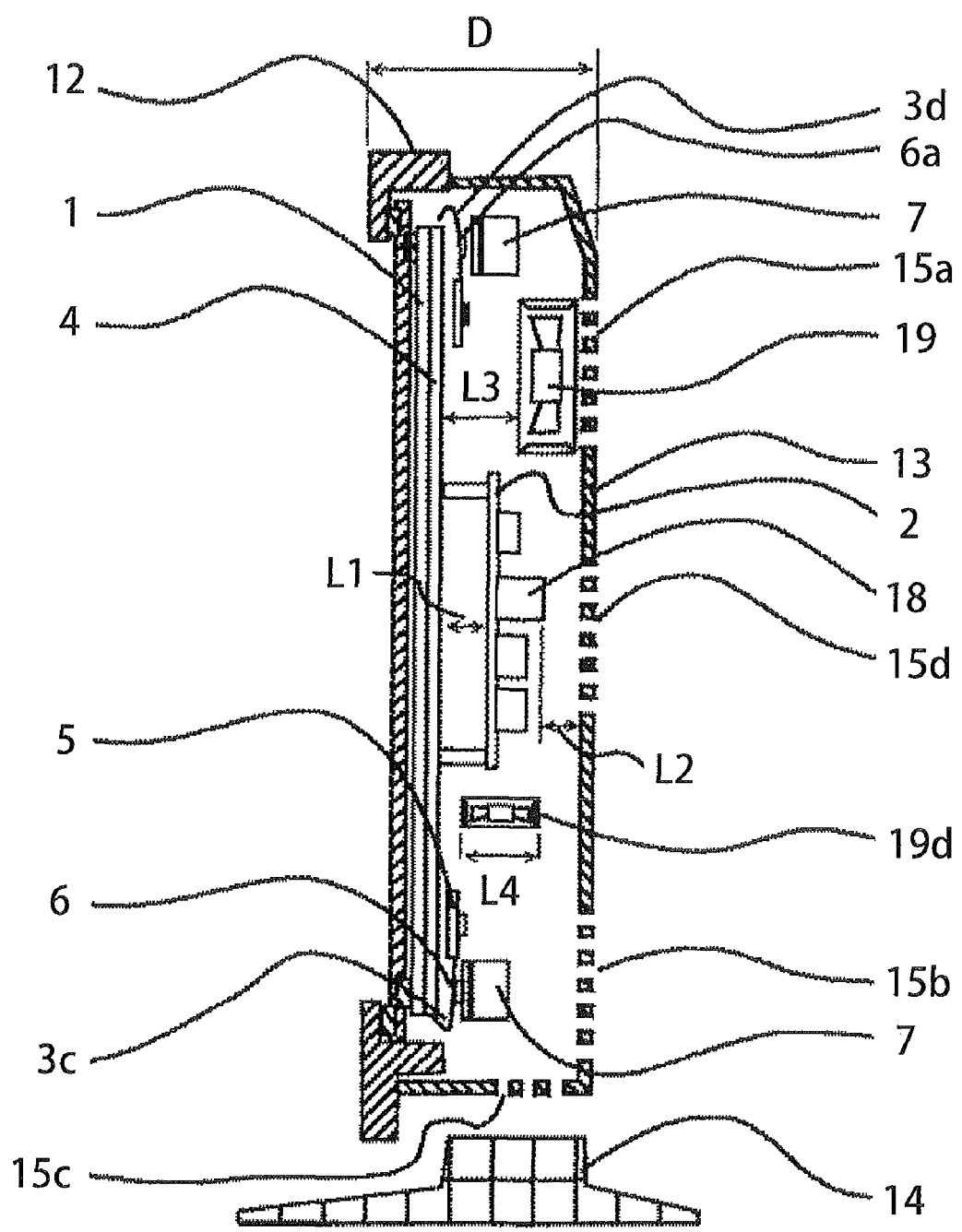
FIG. 7 is a cross-section view of the conventional structure of the image display, corresponding to the A-A cross-section in FIG. 1.
Figure 8:
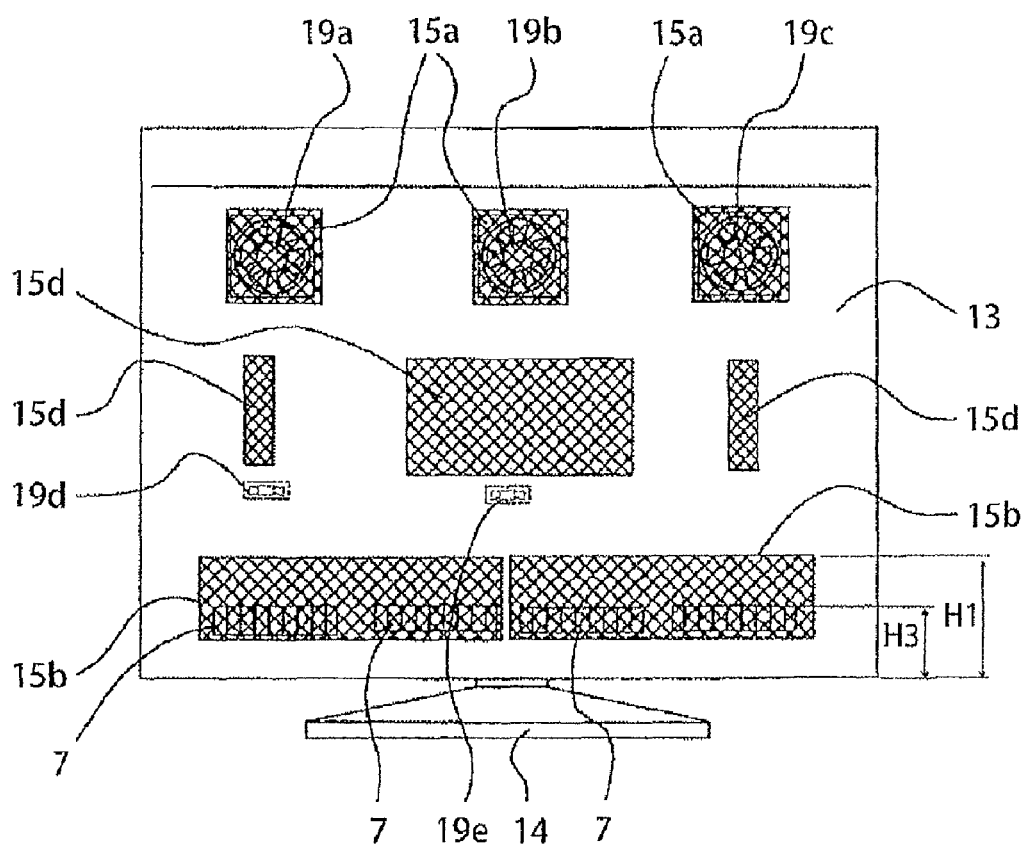
FIG. 8 is a rear surface view of the image display of the conventional structure.
Figure 9:
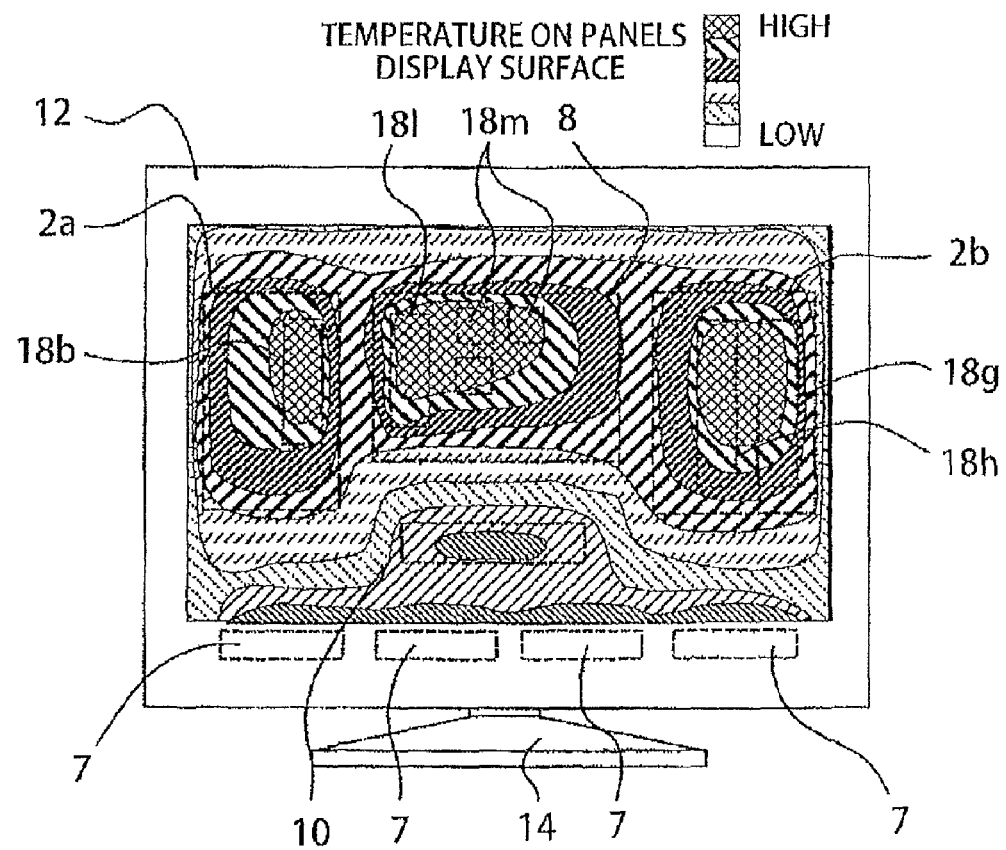
FIG. 9 is a view showing distribution of temperatures on a front surface of a display panel of the conventional structure.
Figure 10:
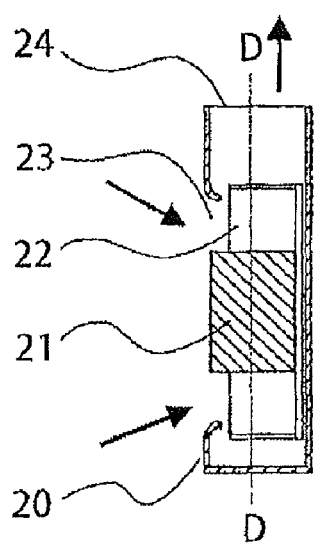
FIG. 10 is a cross-section view of a centrifugal fan.
Figure 11:
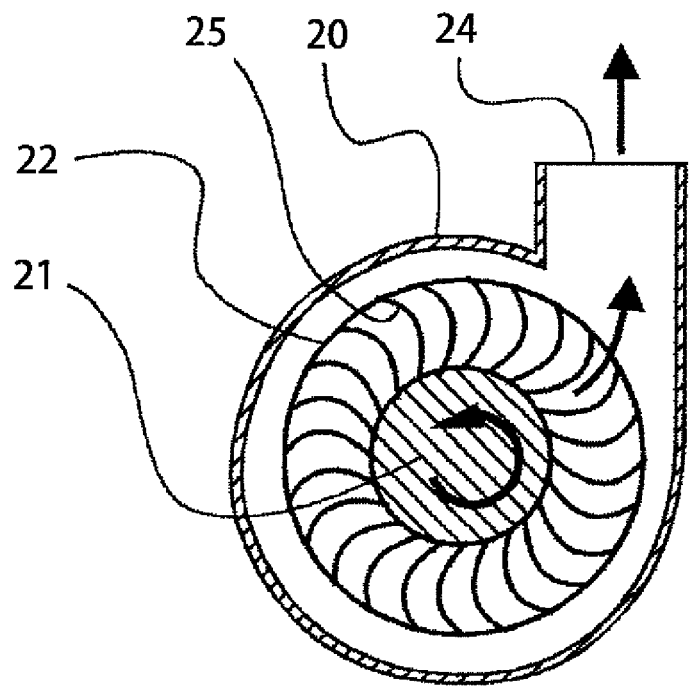
FIG. 11 is a cross-section view of a sirocco fan, seen on a D-D cross section in FIG. 10.
Figure 12:
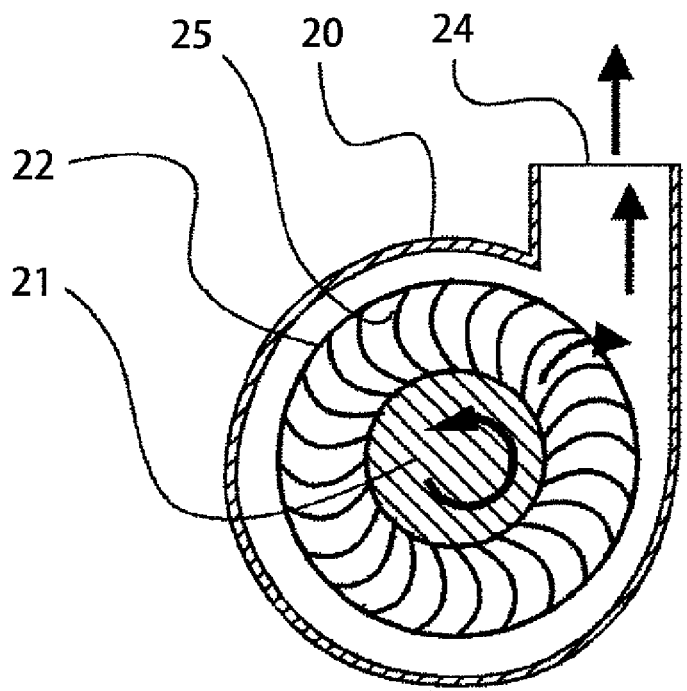
FIG. 12 is a cross-section view of a turbo fan, seen on the D-D cross section in FIG. 10.
Figure 13:
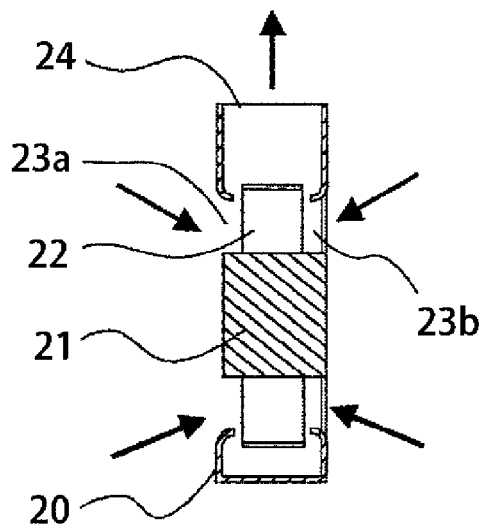
FIG. 13 is a cross-section view of another centrifugal fan.

Hereinafter, explanation will be made on an embodiment 1, by referring to the FIGS. 1 to 13 attached herewith. FIG. 1 is a rear side open-up view showing the principle portions of an image display, according to an embodiment 1 of the present invention. FIG. 2 is an A-A cross-section view of the image display, seeing from a side surface in FIG. 1. FIG. 3 is an outlook view of a rear surface side of the image display shown in FIG. 1. FIG. 4 is a view showing a cover of the image display on the rear-surface side, seen from an inside of a housing shown in FIG. 1. FIG. 5 is a B-B cross-section view showing the image display shown in FIG. 2, seen from a rear surface thereof. FIG. 6 is a C-C cross-section view showing the image display shown in FIG. 5. FIG. 7 is a cross-section view of the conventional structure of the image display, corresponding to the A-A cross-section in FIG. 1. FIG. 8 is a rear surface view of the image display of the conventional structure. FIG. 9 is a view showing distribution of temperatures on a front surface of a display panel of the conventional structure. FIG. 10 is a cross-section view of a centrifugal fan. FIG. 11 is a cross-section view of a sirocco fan, seen on a D-D cross section in FIG. 10. FIG. 12 is a cross-section view of a turbo fan, seen on the D-D cross section in FIG. 10. Moreover, FIG. 13 is a cross-section view of another centrifugal fan.

In FIGS. 1 to 13, a reference numeral 1 depicts a display panel, 2 a display driver substrate, 3 a flexible cable, 4 a chassis, 5 a fixed substrate, 6 an image display element, 6a an image display element provided on an upper end portion of the display panel 1, 7 a first heat sink of the image display element 6, 8 a power source substrate, 9 a cable, 10 a controller unit, 11 a fan, 12 a front surface-side cover (or, a display surface-side cover), 13 a rear surface-side cover (or, a non-display surface-side cover), 14 an installation tool, 15 an opening portion of the rear surface-side cover 13, 15a an upper opening, 15b a lower opening, 15c a bottom opening, 15d a middle opening, 16 a first insulator board, 17 a second insulator board, 18 a circuit part, 19 an axial fan, 20 a case, 21 a motor, 22 an impeller, 23 a suction opening, and 24 a blow-off opening, respectively. Hereinafter, a component having the same function as a component listed above will have attached thereto the same reference numeral, and the explanation thereof will be omitted herein.

Within the image display, provided are (a) a surface, upon which an image on the display panel 1 shown in FIG. 2 is displayed, corresponding to a front surface (or, a front side), and (b) a reverse side (or, a rear surface or a rear side) of the display panel module 1, on which the display driver substrate 2, etc., are provided. Hereinafter, for convenience of explanation, the left and right directions are defined by a direction when seeing the image display from a front side thereof, and the up and down directions are defined by an up and down under the condition where the image display is installed, as is shown in FIG. 2.

As is shown in FIG. 1, at an end of the display panel 1 is provided a flexible cable 3, for supplying a video signal and driving electric power to the display panel 1. In many cases, the flexible cable 3 may be provided on the left and right end surfaces and a lower end surface of the display panel 1. FIG. 1 shows a case where a flexible cable 3a is provided on the left-side end surface, a flexible cable 3b is provided on the right-side end surface, and a flexible cable 3c is provided on the lower end surface. The flexible cables 3a, 3b and 3c are connected on the display driver substrates 2a and 2b and the fixed substrate 5, respectively, which are provided on the chassis 4 connected on the rear surface of the display panel 1, under the condition of being turned up in "U"-like shape. The flexible cables 3 are provided so that they cover almost all of the side surfaces and the lower surfaces of the display panel 1, in order to transfer the video signal and the electric power to all of the pixels of the display panel 1 in the vertical and the horizontal directions of the display panel 1. A plural number of image display elements 6 are provided along with the flexible cable 3c at the lower side-end surface. Because of instances where heat generation thereof becomes large (depending on an image displayed), the image display elements 6 are connected to the first heat sink 7 in order to be cooled. Electric power from the power source substrate 8 is supplied, through the cable 9, to the image display element 6 on the lower end side of the display panel 1 and the display driver substrates 2a and 2b, for regulating voltage of electric power from an external power source not shown in the figure, and the video signal inputted from the controller unit 10.

Although FIG. 1 shows an example of a power source substrate formed as one (1) piece of substrate, there may be an applied power source substrate having a structure made of a plural number of substrates, and connected to cables in order to function. On the display driver substrates 2a and 2b and the power source substrate 8 are mounted the circuit parts 18. FIG. 5 shows an example, wherein on the display driver substrate 2a are mounted: an IC 18a, a second heat sink 18b, a capacitor 18c and a coil 18d; and on the display driver substrate 2b are mounted: ICs 18e and 18f, second heat sinks 18g and 18h, a capacitor 18i and a coil 18j; and further on the power source substrate 8 are mounted: an IC 18k, a second heat sink 18l, a transformer 18m, a capacitor 18n, a coil 18o. The second heat sinks 18b, 18g, 18h and 18l on the substrates may be disposed in an area thereof in a comb-like manner, as is shown in the cross-section view of FIG. 6, for example, in order to increase or improve the characteristic of heat radiation or dissipation thereof.

Within the housing are also stored the fans 11. FIG. 1 shows an instance of installing: one (1) set of fan 11a under the display driver substrate 2a, one (1) set of fan 11b under the display driver substrate 2b, and two (2) sets of fans 11c and 11d under the power source substrate 8, respectively. The number of the fans 11 under the display driver substrates 2a and 2b and the power source substrate 8 may be more in each area than shown in FIG. 1. Also, alternately, depending upon an area, the fan corresponding to the fan 11a may not be provided, for example.

As for the fan 11, a centrifugal fan is applied. Herein, the centrifugal fan is a sirocco fan or a turbo fan. The centrifugal fan 11 comprises, as is shown in FIG. 10: the case 20, the motor 21, and the impeller 22 (a part formed with the motor as a unit), wherein air sucked from the suction opening 23 is blown out from the blow-off opening 24 (the blow-off opening 24 formed in the direction perpendicular to the suction surface), utilizing a centrifugal effect due to rotation of the impeller 22. Within the sirocco fan 11, a large number of blades 25 for building up the impeller 22 are so formed that, as is shown in FIG. 11, an outer periphery of the blades of the impeller 22 is inclined into the rotation direction of the impeller 22. Within the turbo fan, a large number of blades 25 for building up the impeller 22 are so formed that, as is shown in FIG. 12, an outer periphery of the blades of the impeller 22 is inclined into the direction opposite to the rotation direction of the impeller 22. FIG. 10 illustrates an instance where the centrifugal fan 11 has only one suction opening 23, however, as indicated by 23a and 23b in FIG. 13, the suction opening 23 may be provided on both sides of the centrifugal fan 11.

As is shown in FIG. 2, the housing of the image display covers the display panel 1, various equipments by the front surface-side cover 12, and the rear surface-side cover 13 (from an outside thereof), and is installed or attached with the installation tool 14. On the rear surface-side cover 13 are provided a plural number of openings 15, and as is shown in FIGS. 2 and 3, provided are the upper opening 15a, the lower opening 15b, and the bottom opening 15c. Although the figures do not show detailed configuration of the openings, the openings may be made up with a porous plate or a slit, or a mesh, etc., for example. The dotted lines in FIG. 3 depict the positions where the fans 11 are installed inside the housing.

Furthermore, as is shown in FIGS. 1 and 2, the display driver substrates 2a and 2b and the power source substrate 8 are installed at positions where these substrates oppose a surface of the chassis 4 on which are provided first insulator boards 16 made of a material having an electrical insulation characteristic. Those first insulator boards 16 are provided (i.e., 16a for the display driver substrate 2a, 16b for the display driver substrate 2b, and 16c for the power source substrate 8, respectively). Also, as is shown in FIGS. 1 and 4, on the surface of the rear surface-side cover 13 of that position, the second insulator boards 17, made of a material having an electrical insulation characteristic, are provided at the positions where the second insulator boards 17 oppose the display driver substrates 2a and 2b and the power source substrate 8. Those second insulator boards 17 are provided (i.e., 17a for the display driver substrate 2a, 17b for the display driver substrate 2b, and 17c for the power source substrate 8, respectively). The lines shown on the second insulator boards 17a, 17b and 17c in FIG. 4 indicate the positions of the display driver substrates 2a and 2b and the power source substrate 8, which are provided opposite thereto respectively, and are provided to cover areas approximately equal to or larger than that of those substrates.

An example of a conventional structure of an image display is shown in FIGS. 7 and 8. The conventional structure has a size "D" of about 100 mm in depth thereof. It installs substrates such as: the display driver substrate 2a mounting circuit parts thereon, for example, at a distance "L1" of approximately 10 to 15 mm from the chassis 4, and at a distance "L2" of approximately 10 to 15 mm between a part of the circuit parts 18 closest to the rear surface-side cover 13 and that rear surface-side cover 13, and has the image display element 6 and the first heat sink 7 at the lower end of the display panel 1. Also, the conventional structure has another image display element 6a at the upper end of the display panel, and control of both the upper and lower sides of display image is carried out through the flexible cable 3d.

For this reason, since the heat sources are disposed separate from each other (i.e., at the upper and the lower ends of the display panel 1), it is easy to suppress an increase of temperature, if heat generation by the image display elements 6 and 6a increases. Also, since the side in depth is about 100 mm, it is possible to maintain the distance "L3" to be around 30 mm to 50 mm from the chassis 4, even if the axial fans 19a, 19b and 19c (each having thickness of about 20 mm) are installed therein, as is shown in FIG. 7. For this reason, it is possible to obtain a relatively large flow rate by practically using the characteristics of the axial fan (i.e., a large flow rate can be easily obtained).

With provision of the axial fans 19d and 19e having an outer diameter "L4" of about 60 mm, and disposed in periphery of the display driver substrates 2 and the power source substrate 8 (as is shown in FIGS. 7 and 8), there may be an instance of locally cooling those substrates. Also, with provision of an opening 15d, at a middle of the rear surface-side cover 13, as is shown in FIGS. 7 and 8, ventilation is accelerated within the housing. In an upper portion of the display panel 1, since heat generated from the display driver substrates 2a and 2b and the power source substrate 8, etc. increases due to the accumulated natural or free convection, then the temperature thereof can easily increase. However, with mounting of the large-sized axial fans 19a, 19b and 19c, each having a large flow rate, and the ease of sucking of air with large-sizing of the middle opening 15d and the low opening 15b of the rear surface-side cover 13, the image display element 6a and the display panel 1 can operate at their upper limit temperature, or at a lower temperature.

By the way, as a result of the studies made by the present inventors, when thinning the depth "D" of the housing to 35 mm (for example), if the thickness of the display driver substrates 2a and 2b and the power source substrate 8 are reduced, and the various kinds of circuit parts on the substrates within the apparatus shown in FIG. 7 are replaced by thin-sized parts, it becomes necessary to reduce the distance "L1" between the chassis 4 and the display driver substrates 2a and 2b, and the power source substrate 8, down to about 5 mm. There also is a necessity of reducing the distance "L2" between the rear surface-side cover 13 and the display driver substrates 2a and 2b, and the power source substrate 8, down to about 5 mm. Moreover, if the distance between the display driver substrates 2a and 2b and the power source substrate 8 and the chassis 4, and the rear surface-side cover 13, becomes small, down to about 5 mm, then from a viewpoint of electric safety, it becomes necessary to further insert insulator boards into the narrowed gaps defined between both of those elements.

When reducing the distance "L1" between the chassis 4 and the display driver substrates 2a and 2b and the power source substrate 8 down to about 5 mm, then the temperature distribution on the front surface of the display panel becomes as shown in FIG. 9, and the temperature of the display panel 4 increases in particular at the position where the display driver substrates 2a and 2b and the power source substrate 8 are mounted on the chassis. The temperature of the display panel 4 increases is due to shrinking of the distance "L1" between those substrates and the chassis 4. Ventilation into a space of the gaps is reduced remarkably, and therefore heat generated on the display panel 1 cannot be radiated or dissipated easily through thermal conductivity (even if transferred to the chassis 4 connected to the display panel 1), since thermal conductivity due to convection from the chassis 4 to air is greatly reduced in comparison to the conventional structures.

According to the result of the studies made by the present inventors, it is confirmed that an increase of temperature on the display panel 1 (corresponding to the positions where the substrates are provided) can be greatly reduced, if the gap distance "L1" is kept to be approximately equal or greater than 10 mm. Also, as is shown in FIG. 1, for the purposes of electric safety, the first insulator boards 16a, 16b and 16c are provided on the surface of the chassis 4, at positions where the display driver substrates 2a and 2b and the power source substrate 8 oppose thereto.

In this instance, the insulator boards are made of a resin material low in thermal conductivity (i.e., about 0.1 to 1 (W/m·° K)), which is greatly smaller in thermal conductivity than the metal made chassis 4 having a thermal conductivity of about 30 to 200 (W/m·° K). The insulator boards build up thermal resistance on the surface of the chassis, at positions where the first insulator boards 16a, 16b and 16c are provided, and bring about an adiabatic effect and also an increase of temperature, in comparison to another position where no such first insulator board is provided. As a result of measurement in the experiments made by the present inventors, with provision of the first insulator boards 16 on the chassis 4, the temperature of the display panels 1 increases about 2° K, at the position corresponding to that provision thereof.

Furthermore, within the conventional structure shown in FIG. 7, it is easy to install the large-sized axial fans 19a, 19b and 19c, with which a large flow rate is easily obtained. However, since those fans have a thickness of about 20 mm, when reducing the depth "D" of the housing down to about 35 mm, then the distance "L3" between the suction surface of the fan and the chassis 4 can be maintained to be only about 10 to 15 mm, at the most, if changing the axial fan with a thin-type fan having thickness of about 10 to 15 mm. For this reason, for the axial fans 19a, 19b and 19c, ventilation resistance is greatly increased, on the suction side, and therefore a working flow rate is reduced.

As a result of measurement in the experiments made by the present inventors, it is confirmed that when the gap distance "L3" is narrowed to be equal or less than 20 mm, the flow rate of the axial fans 19 is greatly reduced in comparison to that of the conventional structure. With the small-sized axial fans 19d and 19e, which are provided in the periphery of the display driver substrates 2a and 2b and the power source substrate 8, the flow rate is obtained with using one having the outer diameter "L4" of about 60 mm, in the conventional structure. However, when thinning the depth "D" down to about 35 mm, for example, then it is only possible to install therein a fan having an outer diameter "L4" of about 20 mm. For this reason, there are drawbacks in that the flow rate is greatly reduced, and that the fan noise goes up abruptly if trying to obtain that flow rate by increasing the rotating speed thereof. Also, since the middle opening 15d and the lower opening 15b of the rear surface-side cover 13, have relatively large openings, and are positioned in the periphery of the display driver substrates 2a and 2b and the power source substrate 8, there is also a drawback that the noises of the fans easily propagate to the outside of the housing. Herein, in embodiment 1, as is shown in FIGS. 2 and 6, the display driver substrates 2a and 2b and the power source substrate 8 are installed in such direction that the circuit parts 18 on the display driver substrates 2a and 2b and the power source substrate 8 oppose to the chassis 4. The centrifugal fans 11a, 11b, 11c and 11d, directing the blow-off openings up in FIG. 2, are provided on the lower side of the display driver substrates 2a and 2b and the power source substrate 8. Moreover, those centrifugal fans 11a, 11b, 11c and 11d ventilate air into the gaps where the chassis 4 opposes to the display driver substrates 2a and 2b and the power source substrate 8. A gap distance "L5" between the main suction surfaces of the centrifugal fans 11a, 11b, 11c and 11d and the rear surface-side cover 13 is approximately 10 to 15 mm. In case of the centrifugal fan, since the gap distance between the suction surface and the obstacle does not influence the flow rate, remarkably, as in the axial fan, then it is possible to maintain an appropriate flow rate.

Also, with the axial fan of the conventional structure, since the perforated plate is provided on the upper opening 15*a* in vicinity of the exhaustion side, as is shown in FIG. 7, this becomes ventilation resistance, and thereby lowering the flow rate. However, with the centrifugal fan, since air from the exhaust surface flows naturally into an upper direction in FIG. 2, along with the chassis 4, but without colliding directly upon the chassis 4, since it is bent 90° within the fan, from the suction side to the exhaust side, ventilation resistance is reduced, in particular, on the exhaust side, and therefore it is easy to maintain the flow rate necessary for cooling.

Air suctions of the centrifugal fans 11*a*, 11*b*, 11*c* and 11*d* are mainly conducted from the lower opening 15*b* and the bottom opening 15*c* of the rear surface-side cover 13. Conventionally, as is shown in FIG. 7, since it is provided on the upper end of the display panel 1, it is difficult to cool the image display elements 6. In contrast, with embodiment 1, since the image display elements 6 are integrated on the lower end of the display panel 1, it is necessary to cool the image display elements 6 with an enough margin thereof.

In embodiment 1, the lower opening 15*b* of the rear surface-side cover 13 is provided at the position facing to the first heat sink 7 of the image display elements 6. The height "H1" of the upper-side position of the lower opening 15*b* of the rear surface-side cover 13 is determined to be smaller than the height "H3" of the upper-side position of the first heat sink 7, or within 5 mm if higher than the upper-side position of the first heat sink 7. Also, the height "H2" of the lower-side position of the lower opening 15*b* of the rear surface-side cover 13 is determined to be equal to or smaller than the height "H5" of the middle position of the first heat sink 7 in the vertical direction. With thickness reduction of the housing, an area of the bottom opening 15*c* becomes small, and the lower opening 15*b* (i.e., the opening in vicinity of the centrifugal fan 11) is a main opening. However, because of adoption of the structure mentioned above, since air passes through the first heat sink 7 of the image display elements 6, with certainty, when it passes through the lower opening 15*b*. Therefore it is possible to cool the image display elements 6, with stability.

Also, with the structure shown in FIG. 8, the lower opening 15*b*, in particular, the height "H1" of the upper-side position of the lower opening 15*b* is provided at the position higher than the height "H3" of the upper-side position of the first heat sink 5 by 40 to 50 mm. In this instance, air does not pass through the first heat sink 7, but since almost of air is sucked to the axial fan 19 while passing through the opening on an upper side of the first heat sink 7, then there is a problem that the cooling efficiency of the image display elements 6 is reduced. However, with the structure according to embodiment 1, such problem will be solved. As a result of confirmation through experiments made upon embodiment 1 by the present inventors, there is an effect of reducing the temperature of the image display elements 6 by about 5° K Also, the lower opening 15*b* is provided below the centrifugal fan 11. With this, the suction surface of the centrifugal fan 11 is provided so that it faces to the rear surface-side cover 13. For this reason, noises propagating from an inside of the centrifugal fan 11 through the suction face are shut off, by the rear surface-side cover 13, and they do not directly propagate to the outside of the housing, but they propagate from the lower opening 15*b* and the upper opening 15*a* positioned separately. Therefore there can also be obtained an effect of suppressing the noises of the fans, as heard from the outside of the housing, at the same time.

Also, when thickness reduction the conventional structure shown in FIG. 7 as it is, then the gap distance "L1" between the display driver substrates 2*a* and 2*b* and the power source substrate 8 is about 5 mm (i.e., it is impossible to let air to ventilate therethrough). However, according to the structure of embodiment 1, as is shown in FIG. 2, with installation of the circuit parts 18 of the display driver substrates 2*a* and 2*b* and the power source substrate 8 into the direction facing to the chassis 4, it is possible to enlarge the distance "L1" between the chassis 4 and the substrates 2 and 8 to approximately 15 to 20 mm.

With this structure, since air is sucked from the lower side of the display driver substrates 2*a* and 2*b* and the power source substrate 8, to be ventilated into the upper direction, by the centrifugal fan 11, air is ventilated through the chassis 4 to the display panel 1 and the circuit parts 18, at the same time, then it is possible to achieve thin-size of the apparatus, as well as, an improvement of the cooling efficiency of those parts.

For this reason, the first insulator board 16 is provided on the chassis 4 opposite to the display driver substrates 2*a* and 2*b* and the power source substrate 8, and because of the adiabatic effect due to the first insulator board 16, it is possible to cool the display panel 1 and the circuit parts 18, at a level of maintaining the reliability thereof, even when the temperature increases by 1 to 2° K on the display panel 1 corresponding to the portion where the first insulator board 16 is provided. As a result of measurement of temperature, made by the present inventors, under the condition of installing the display driver substrates 2*a* and 2*b* and the power source substrate 8, so that the circuit parts thereof are provided on the side of the rear surface-side cover 13, upon basis of the structure shown in FIG. 2, there is an effect of lowering the temperature by 7 to 10° K on the front surface of the display panel 1.

The structure of embodiment 1 is, as is shown in FIG. 2, that for cooling the display driver substrates 2*a* and 2*b* and the power source substrate 8, and also the display panel 1, efficiently, with using the centrifugal fan 11. For this reason, there is no need to additionally cool the circuit parts 18 on the display driver substrates 2*a* and 2*b* and the power source substrate 8, with provision of the middle opening on the rear surface-side cover 13, like the conventional structure shown in FIG. 8. Also, the second insulator boards 17*a*, 17*b* and 17*c* are provided between the display driver substrates 2*a* and 2*b* and the power source substrate 8 and the rear surface-side cover 13, for the purpose of the electrical safety, and therefore, the middle opening 15*d* will not function as a ventilation opening, substantially, even if it is provided on the rear surface-side cover 13.

Accordingly, with adoption of embodiment 1, a number of the openings is small when seen from the rear side thereof, and therefore it is possible to provide an image display superior in the design thereof. Also, with the conventional structure as shown in FIG. 7 or 8, the conventional structure has a structure that easily propagates electromagnetic noises generated from the display driver substrates 2*a* and 2*b* and the power source substrate 8, to the outside of the housing. However, with the structure according to embodiment 1, since the circuit parts 18 (the noise sources) are provided on the side of the chassis 4, and are covered by the display driver substrates 2*a* and 2*b* and the power source substrate 8, there is no middle opening 15*d* (which was a main opening for propagating the electromagnetic noises from the rear surface-side cover 13).

With such a structure, there is an effect of suppressing the propagation of noises from the circuit parts 18 to the outside of the housing.

Embodiment 2

Figure 14:
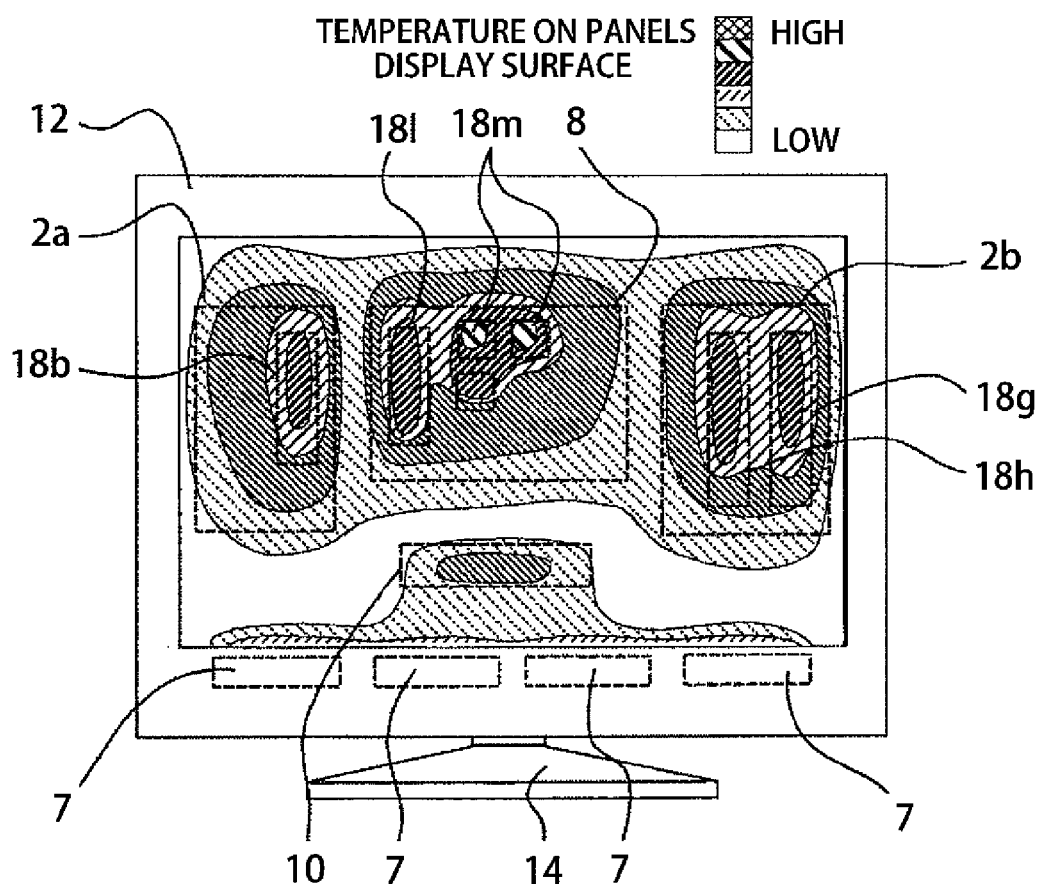
FIG. 14 is a view showing distribution of temperatures on a front surface of a display panel of the structure according to an embodiment 1.
Figure 15:
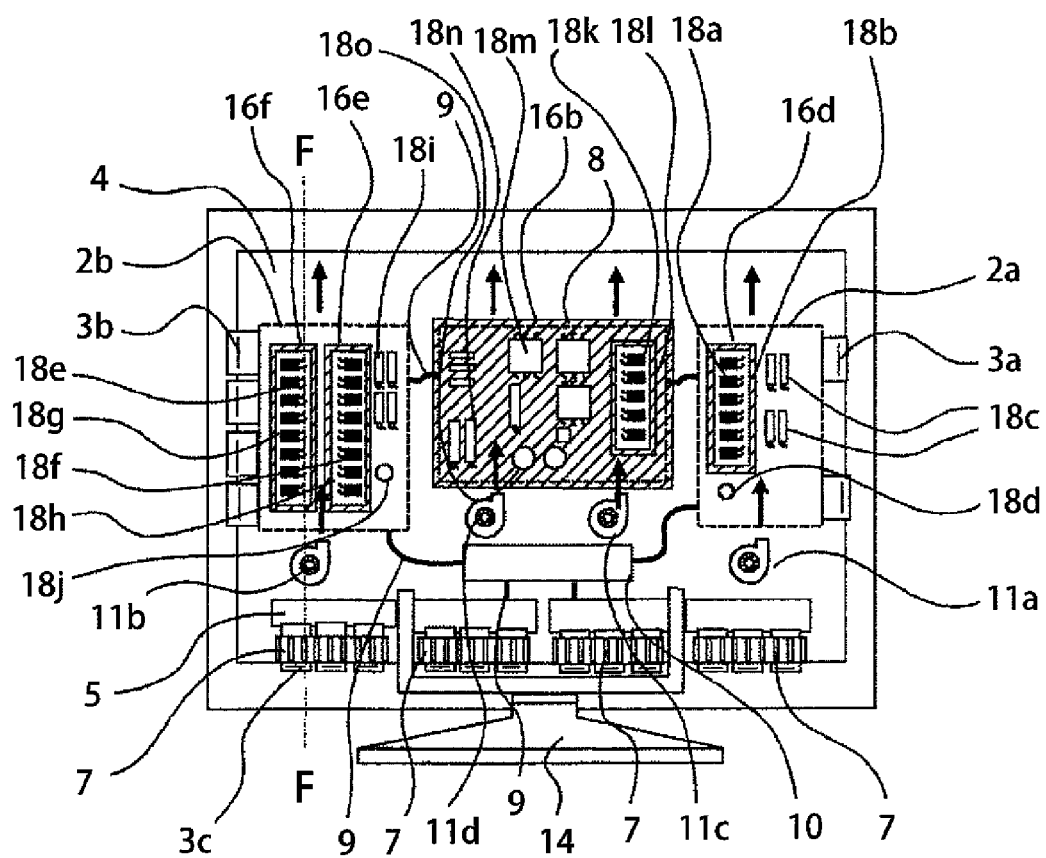
FIG. 15 is a rear side open-up view showing the principle portions of an image display, according to an embodiment 2 of the present invention.
Figure 16:
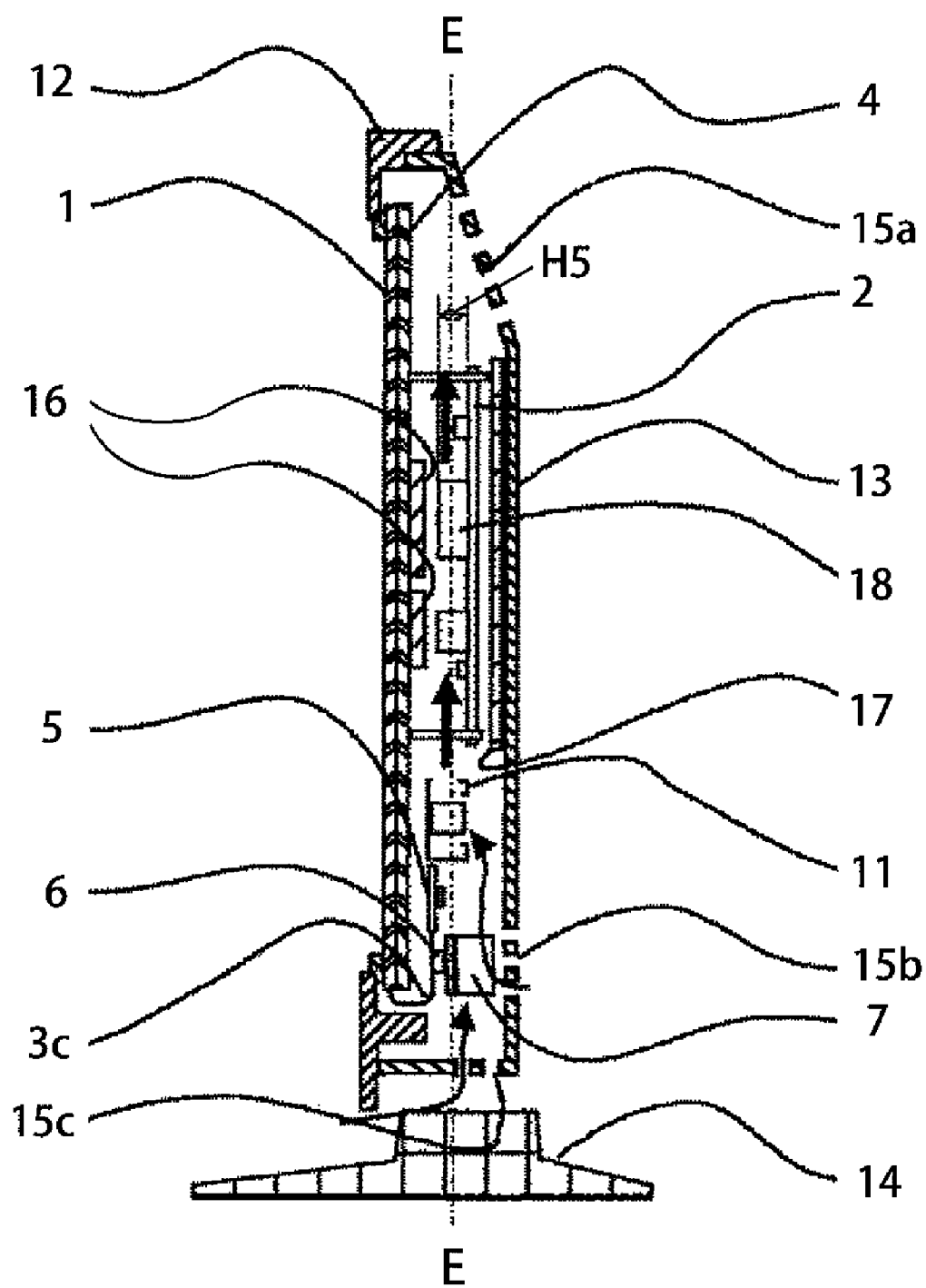
FIG. 16 is a F-F cross-section view of the image display, seen from a side surface in FIG. 15.

Embodiment 2 will be explained by referring to FIGS. 14 to 16. FIG. 14 is a view showing distribution of temperatures on a front surface of a display panel of the structure according to embodiment 1. FIG. 15 is a rear side open-up view showing the principle portions of an image display, according to an embodiment 2 of the present invention. FIG. 16 is a F-F cross-section view of the image display, seen from a side surface in FIG. 15. However, sizes of the display driver substrates 2a and 2b and the power source substrate 8 are shown by broken lines in FIG. 15.

With embodiment 2, as shown in FIGS. 15 and 16, among the circuit parts installed on the display driver substrates 2a and 2b, first insulator boards 16d, 16e and 16f are provided at the positions opposite to the positions of installing the circuit parts, each having height at least equal or greater than 50% of the height "H5" from the display driver substrates 2a and 2b (i.e., at least equal or greater than 50% with respect to the distance from the display driver substrate 2 up to the chassis 4).

FIG. 14 is a view showing distribution of temperatures on the front surface of the display panel 1, corresponding to the structure according to the embodiment 1. The temperature on the front surface of the display panel 1 is greatly reduced when compared to FIG. 9, FIG. 9 being thin-sized following the conventional structure, accompanying with changes in the structures of the fan 11 and the lower opening 15b, and the structure for installing the display driver substrates 2a and 2b and the power source substrate 8.

However, there is a problem that temperatures become locally high, at positions such as: of the second heat sinks 18b, 18g and 18h, etc. high in the height "H2" from the substrate, among the circuit parts 18 on the display driver substrates 2a and 2b and the power source substrate 8. This is because, as is shown in FIG. 6, at the positions of the second heat sinks 18b, 18g and 18h, etc. high in the height "H2" from the substrate, an area of a cross-section is reduced, in a flow passage for air defined between the chassis 4, and ventilation at this portion is locally reduced. Furthermore, it is also because the second heat sinks 18b, 18g and 18h, temperatures of which are increased due to heat generation by the ICs 18a, 18e and 18f, come close to the chassis 4.

As countermeasures for that, the following can be considered: an improvement on the thermal conductivity on the side of the chassis 4, and also changing the structures of the second heat sinks 18b, 18g and 18h, etc. With the structure according to embodiment 2, an improvement is made on the thermal conductivity on the side of the chassis 4.

With the display driver substrates 2a and 2b, from a viewpoint of voltage of the driving circuits thereof, the level of electrical safety is not high, compared to that of the power source substrate 8. For this reason, it is not always necessary to provide the first insulation members 16a and 16b covering all over the area opposite to the display driver substrates 2a and 2b, the first insulation members may be provided as 18b, 18g and 18h, only on the chassis 4 at the areas opposite to the parts, the height "H2" from the substrate is high, among the circuit parts.

With such a structure as mentioned above, while maintaining the electrical reliabilities thereof, but regarding the heat radiation or dissipation transferring from the display panel 1 to the chassis 4 through the thermal conductivity and dissipating into the housing, although the heat dissipation is prevented by the adiabatic effect due to the first insulation members 16a and 16b having wide areas, however since surface areas are increased on the chassis 4, where no such first insulation members 16a and 16b exist, then there is an acceleration of heat dissipation from the chassis 4 to air within the housing.

For this reason, an average temperature of the display panel 1 at the portions opposite to the display driver substrates 2a and 2b is decreased, and therefore it is possible to reduce temperatures at positions opposite to the second heat sinks 18b, 18g and 18h, etc., where the temperature is locally high. As a result of confirmation through the experiments made upon the structure mentioned above by the present inventors, there is an effect of reducing the temperature of the display panel 1, by about 1° K

Embodiment 3

Figure 17:
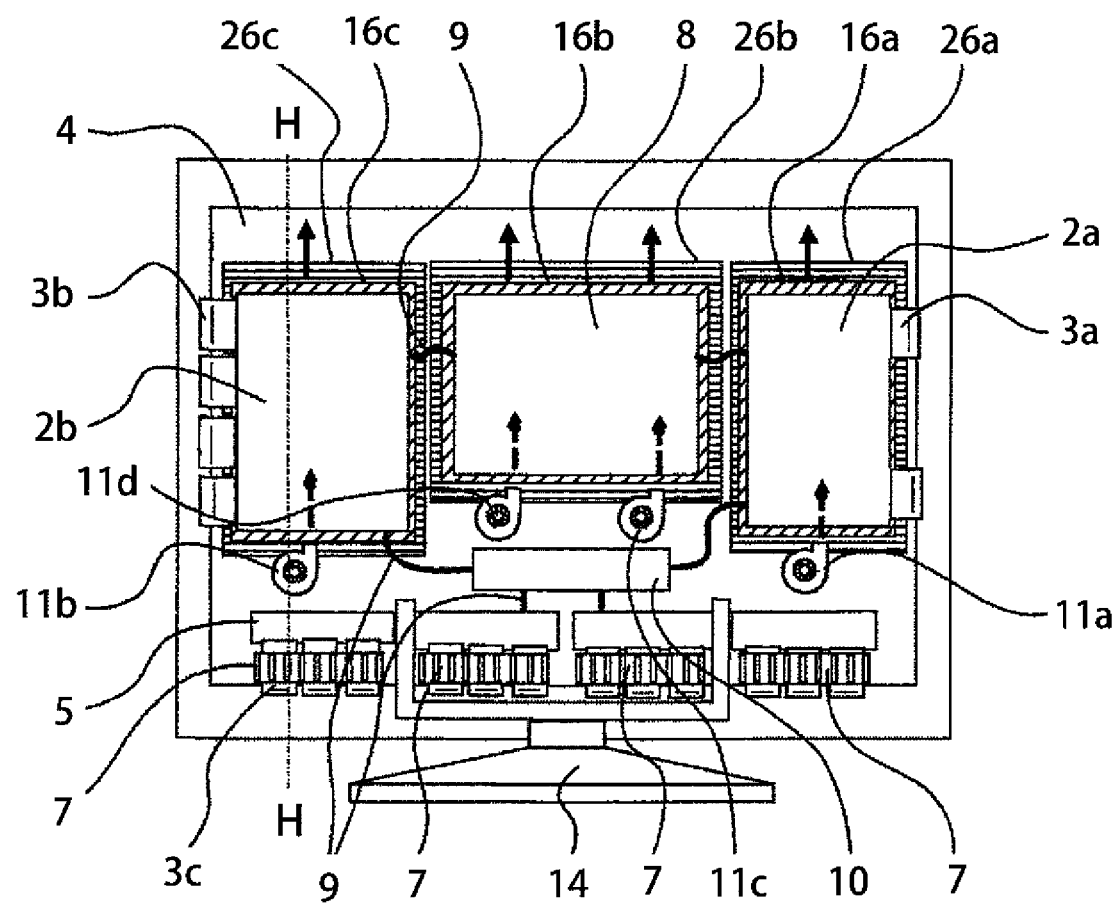
FIG. 17 is a rear side open-up view showing the principle portions of an image display, according to an embodiment 3 of the present invention.
Figure 18:
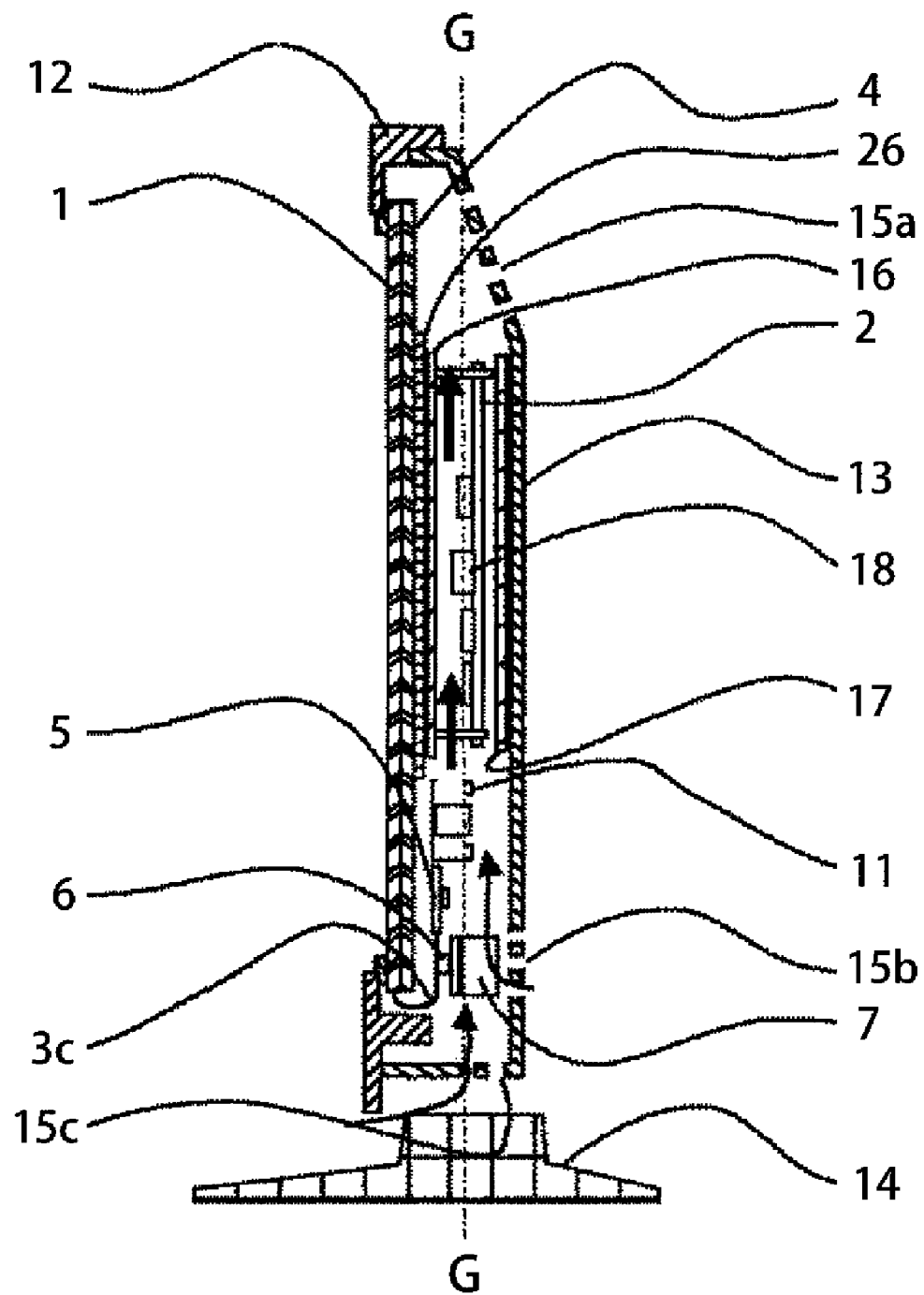
FIG. 18 is a H-H cross-section view of the image display, seen from a side surface in FIG. 17.

Embodiment 3 will be explained by referring to FIGS. 17 and 18. FIG. 17 is a rear side open-up view showing the principle portions of an image display, according to embodiment 3 of the present invention, and is showing a G-G cross-section of FIG. 18. FIG. 18 is a H-H cross-section seeing the H-H cross-section from a side surface.

In FIGS. 17 and 18, reference numerals 26a, 26b ad 26c depict plate-like members made of high thermal conductivity, and in particular, a material having a thermal conductivity higher than the thermal conductivity of the chassis 4, in the direction of in-plane thereof. Though the chassis 4 is made of a metal member such as: an iron alloy or an aluminum alloy, etc., in many cases, having the thermal conductivity of around 30 to 200 (W/m·° K), however it is possible to obtain the thermal conductivity of 400 to 700 (W/m·° K) in the in-plane direction thereof, if applying a graphite sheet obtained by processing graphite into the sheet-like shape.

Embodiment 3 has the structure of connecting the members 26a, 26b ad 26c of high thermal conductivity, between the insulator boards 16a, 16b and 16c, which are provided on the chassis 4, at portions corresponding to the positions opposite to the display driver substrates 2a and 2b, or the power source substrate 8, and the chassis 4. Thus, it is the structure of comprising the members, which are provided between the first insulator boards 16a, 16b and 16c and the chassis 4 and are high in the thermal conductivity in the in-plane direction thereof.

With such a structure as mentioned above, regarding the heat radiation or dissipation transferring from the display panel 1 to the chassis 4 through the thermal conductivity and dissipating into the housing (a temperature distribution is as is shown in FIG. 14), heat radiation or dissipation is prevented by the adiabatic effect due to the first insulation members 16a and 16b having wide areas. However, the members 26a, 26b and 26c of high thermal conductivity dissipate the heat into wide regions in the in-plane direction. For this reason, it is possible to locally reduce temperatures at the positions opposite to the second heat sinks 18b, 18g and 18h. Furthermore, since it is possible to maintain the sizes of the first insulator boards 16, there can be obtained an advantage that it can be also applied onto the chassis 4 opposite to the power source substrate 8. As a result of confirmation through the experiments made upon the structure by the present inventors, there is an effect of reducing the temperature of the display panel 1, by about 1 to 1.5° K

Embodiment 4

Figure 19:
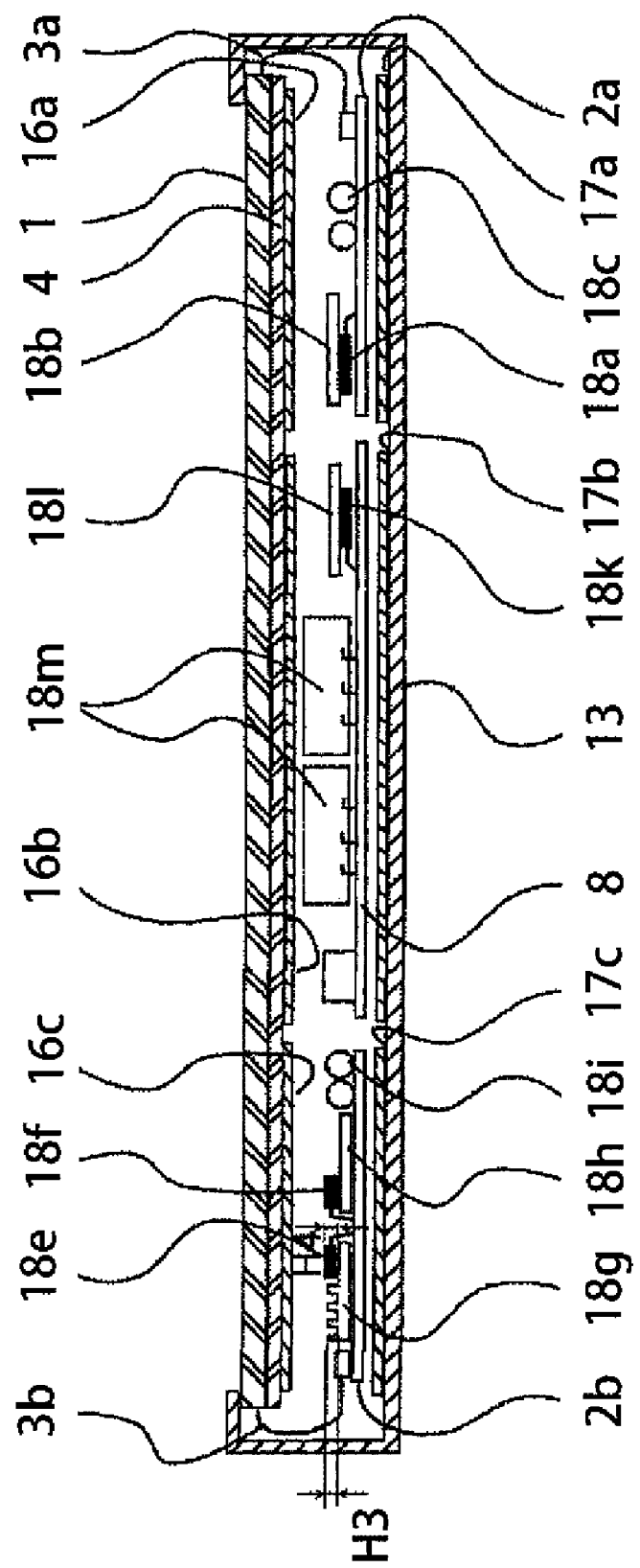
FIG. 19 is a cross-section view of the image display, according to an embodiment 4 of the present invention.

Embodiment 4 will be explained by referring to FIG. 19. FIG. 19 is the cross-section view of the image display according to embodiment 4, showing the structure thereof at C-C cutting position in FIG. 5.

In embodiment 4, there are provided plate-like second heat sinks 18*b*, 18*g*, 18*h* and 18*l* connected to an element within the circuit parts, which are mounted on the power source substrate 8. Also, the height "H3" of the second heat sink in the direction towards the chassis 4 is lower than the height of the circuit parts mounted on the power source substrate 8 in the direction towards the chassis 4. A plane portion of the second heat sink is disposed nearly in parallel with the surface of the chassis 4.

In FIG. 6, showing embodiment 1, since fin portions of the second heat sinks 18*b*, 18*g*, 18*h* and 18*l* come close to the chassis 4, the cross-section area of the flow passage is reduced, and then ventilation is reduced in the portion of the second heat sinks 18*b*, 18*g*, 18*h* and 18*l*. However, with embodiment 4, as is shown in FIG. 19, since the second heat sinks 18*b*, 18*g*, 18*h* and 18*l* are plate-like in the shape, but without the fin portions, or the height "H3" thereof is equal or lower than height "H4" of the IC circuit 18*e* if they have the fins projecting from the plate, then the cross-section of the flow passage is expanded, thereby hardly preventing ventilation, and with an increase of the flow rate, cooling of the display panel 1 is accelerated on the portions opposite to the second heat sinks 18*b*, 18*g*, 18*h* and 18*l*. As a result of confirmation through experiments made by the present inventors, there is an effect of reducing the temperature of the display panel 1, by about 4 to 6° K In general, in the cooling thereof, an increase of the area for heat transfer on the second heat sinks 18 contributes to an acceleration of cooling. However, in the case of the thin-type of image display having a housing depth equal or less than 35 mm, because of the structure of the parts installed therein, ventilation is greatly prevented, if the cross-section area of the flow passage is narrowed to be small, and therefore there may be a case where the cooling efficiency can be improved by adapting the structure of maintaining a ventilation flow rate, rather than maintaining the heat transfer area.

However, including those embodiments 1 through 4, the explanation was made in details thereof, with using an example of the structure of the plasma display, but it is needless to say that the present invention is also applicable into other large-sized flat-type image displays such as: a LCD display, an OLED display, etc., for example.

The present invention may be embodied in other specific forms without departing from the spirit or essential feature or characteristics thereof. The present embodiments are therefore to be considered in all respects as illustrative and not restrictive, the scope of the invention indicated by the appended claims rather than by the forgoing description and range of equivalency of the claims are therefore to be embraces therein.

What is claimed is:

1. A image display, comprising:
   a display panel;
   a chassis, which supports said display panel from a rear surface side thereof;
   a front surface-side cover, which is provided on a front side of said display panel;
   a rear surface-side cover, which is provided on a rear side of said display panel and is provided with openings in an upper portion and a lower portion thereof;
   an image display element connected at a lower end of said display panel; display driver substrates, which are connected at left end and right end of said display panel, and on a surface of which opposite to said chassis are provided circuit parts thereof;
   a power source substrate, which supplies driving power to said display driver substrates and said image display element, and on a surface of which opposite to said chassis are provided circuit parts thereof;
   first heat sinks, which are connected with said image display element;
   at least one (1) set of centrifugal fans, blow-off openings of which are provided in a direction towards said substrates, within a space surrounded by said display panel, said front surface-side cover and said rear surface-side cover;
   a first insulator board, which is provided at a position opposite to said display driver substrates and said power source substrate of said chassis; and
   a second insulator board, which is provided at a position opposite to said display driver substrates and said power source substrate on said rear surface-side cover;
   wherein said first insulator board is provided at a position opposite to an installation position of said circuit parts, having at least height equal to or higher than 50% with respect to a distance from said display driver substrates to said chassis, among said circuit parts which are mounted on said display driver substrates.

2. A image display, comprising:
   a display panel;
   a chassis, which supports said display panel from a rear surface side thereof;
   a front surface-side cover, which is provided on a front side of said display panel;
   a rear surface-side cover, which is provided on a rear side of said display panel and is provided with an opening in an upper portion and an opening in a lower portion thereof;
   an image display element connected at a lower end of said display panel;
   display driver substrates, which are connected at left end and right end of said display panel, and on a surface of which opposite to said chassis are provided circuit parts thereof;
   a power source substrate, which supplies driving power to said display driver substrates and said image display element, and on a surface of which opposite to said chassis are provided circuit parts thereof;
   first heat sinks, which are connected with said image display element;
   at least one (1) set of centrifugal fans, blow-off openings of which are provided in a direction towards said substrates, within a space surrounded by said display panel, said front surface-side cover and said rear surface-side cover;
   a first insulator board, which is provided at a position opposite to said display driver substrates and said power source substrate of said chassis; and
   a second insulator board, which is provided at a position opposite to said display driver substrates and said power source substrate on said rear surface-side cover;
   wherein said opening in the lower portion is provided at a position opposite to said first heat sinks;
   wherein an upper side position of said opening in the lower portion is lower than said centrifugal fan, and is also higher than an upper side portion of said first heat sink, but within 5 mm; and wherein a lower side position of said opening in the lower portion is at a position lower than a middle position of said first heat sinks.

3. The image display, as described in the claim 1, further comprising:
a member, which is provided between said first insulator board and said chassis, and is higher in thermal conductivity in an in-plane direction thereof, than said chassis.

4. The image display, as described in the claim 1, wherein a second heat sink includes a plate-like heat sink, which is connected with an element among the circuit parts mounted on said power source substrate.

5. The image display, as described in the claim 4, wherein a height of the second heat sink in the direction towards said chassis is lower than a height of the circuit parts mounted on said display driver substrates and said power source substrate in the direction towards said chassis.

6. The image display, as described in the claim 4, wherein the plane portion of the second heat sink is provided nearly in parallel with a surface of said chassis.

* * * * *